Oct. 6, 1936. K. C. BLACK Re. 20,122

RECTIFIER CIRCUITS

Original Filed April 23, 1930

Inventor:
Knox Charlton Black,
By Byrnes, Townsend & Potter,
Attorneys.

Reissued Oct. 6, 1936

Re. 20,122

UNITED STATES PATENT OFFICE 20,122

RECTIFIER CIRCUIT

Knox C. Black, Mountain Lakes, N. J., assignor, by mesne assignments, to Radio Corporation of America, New York, N. Y., a corporation of Delaware Original No. 1,869,089, dated July 26, 1932, Serial No. 446,755, April 23, 1930. Application for reissue March 27, 1933, Serial No. 663,074

9 Claims. (Cl. 250—27)

This invention relates to vacuum tube rectifier circuits and methods of rectification or demodulation.

Although the advantages of the diode or Fleming valve rectifier have been recognized, it has been generally conceded that the absence of any amplification of the carrier or audio frequency voltage more than offsets the good qualities of the diode rectifier.

Objects of the present invention are to provide methods of and circuits for combining diode rectification and amplification in a single rectifier stage. A further object is to provide a rectifier stage including a multi-element vacuum tube, the circuit arrangements being such that the tube functions both as an amplifier and as a diode rectifier. More particularly, an object is to provide a rectifier stage of the type stated in which the tube functions as a diode rectifier and as an amplifier for the rectified signal.

These and other objects of the invention will be apparent from the following specification, when taken with the accompanying drawing in which:

Figs. 1 to 5 inclusive are circuit diagrams illustrating different embodiments of the invention.

In accordance with the present invention, the rectifier stage includes a multi-element vacuum tube and circuit elements so associated therewith that one element cooperates with the cathode to function as a diode rectifier, and a plurality of other elements cooperate with the cathode to function as an amplifier.

Figure 1:
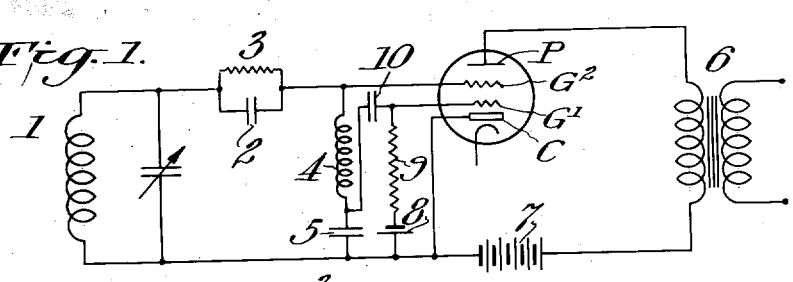
Figure 2:
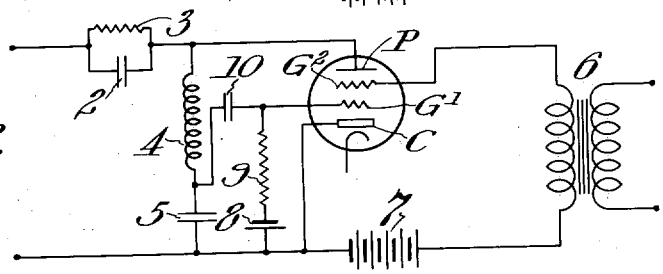

As shown diagrammatically in Figs. 1 and 2, the vacuum tube may be a tetrode of the known commercial types in which there are a plurality of cylindrical elements surrounding and co-axial with the cathode. In the circuit of Fig. 1, the tuned input circuit 1 is connected between the grid $G^2$ and the cathode C, a grid condenser 2 and shunt resistance 3 being arranged between the tuned circuit and the grid. A radio frequency choke 4 and radio frequency by-pass condenser 5 are connected between the grid $G^2$ and the cathode, the junction of the choke 4 and condenser 5 being connected to the inner grid $G^1$. The plate P is connected to the cathode through an impedance, such as the primary of an audio frequency transformer 6, and a source 7 of plate current. A grid bias is applied to grid $G^1$ by battery 8 and the grid resistance 9; this bias voltage being blocked from grid $G^2$ by the condenser 10.

The grid $G^2$ and cathode C are at substantially the same direct current potential and operate as a diode rectifier for the signal voltage impressed across the tuned circuit 1. The rectified voltage resulting from the diode rectification is impressed across the inner grid $G^1$ and cathode C by means of the radio frequency choke 4. The by-pass condenser 5 substantially prevents any radio frequency potential difference between the inner grid $G^1$ and the cathode. The cathode, inner grid and plate act as a triode for the amplification of the audio frequency voltage resulting from the diode rectification. Though the grid $G^2$ is positioned in the electron stream between the cathode C and plate P, the radio frequency voltage on this grid has a comparatively small effect upon the electron stream since the grid $G^2$ is located outside of the amplifier control grid $G^1$.

As shown in Fig. 2, the plate P may act as one element of the diode rectifier. The rectified voltage is then impressed upon the inner grid $G^1$ and the amplified audio output is developed between the outer grid $G^2$ and the cathode. The other elements of the circuit may be identical with the corresponding elements of the Fig. 1 circuit.

Figure 3:
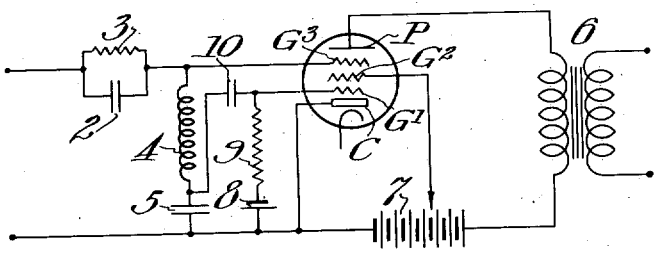

The pentode rectifier circuit of Fig. 3 is similar to that of the Fig. 1 circuit and corresponding elements have been identified by the same reference numerals as those employed in Fig. 1. The essential difference in the Fig. 3 circuit is the introduction of the screen grid $G^2$ between the diode rectifier grid $G^3$ and the audio frequency control grid $G^1$.

Figure 4:
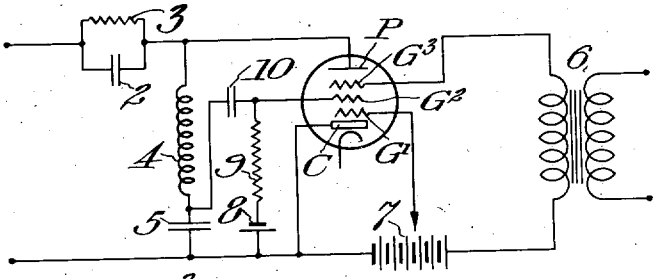
Figure 5:
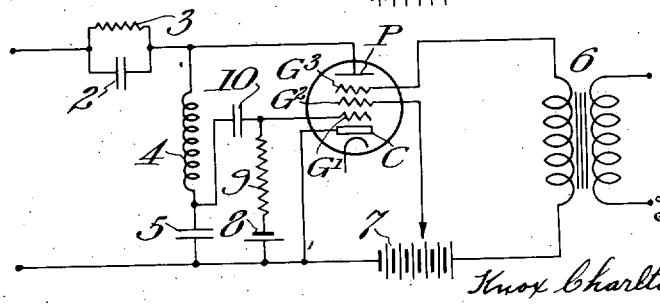

As shown in Figs. 4 and 5, the plate P may serve as the anode of the diode rectifier. In the Fig. 4 circuit, the audio frequency voltage is impressed upon the intermediate grid $G^2$, the inner grid $G^1$ is a space charge grid and the outer grid $G^3$ serves as the anode of the four-element amplifier.

In the Fig. 5 circuit, the audio frequency response of the diode is impressed upon the inner grid $G^1$, the grid $G^2$ serves as a screen grid and the outer grid $G^3$ is the anode element of the amplifier.

As compared with the usual circuit rectification systems in which the carrier voltage is impressed upon the inner grid element, the invention provides linear rectification over a wide range of impressed signal voltages. The customary grid circuit rectifier overloads at relatively low signal voltages when the radio frequency voltage swing becomes large enough to cause plate rectification in opposition to the grid rectification. As compared with the usual diode rectifier, the invention combines linear rectification and one stage of amplification.

As stated above, the multi-element tubes may be of the usual commercial construction, but it is possible to employ tubes having a diode element that is located outside of the electron stream established between the cathode and the amplifier anode. A tube construction of this type is described and claimed in my copending application Serial Number 446,098, filed April 21, 1930.

I claim:

1. The combination with a vacuum tube having a cathode and a plurality of elements serially arranged in the electron stream established by said cathode, of a diode rectifier circuit connected between said cathode and an element spaced from said cathode, a radio frequency choke connecting said diode element to an element between the same and said cathode, a radio frequency by-pass condenser between said cathode and said second element, and an output circuit between said cathode and a third element which is more remote from said cathode than said second element.

2. In combination, a combined detector-amplifier comprising a tube having its cathode and a remote cold electrode coupled to serve as a diode rectifier circuit, means for impressing high frequency signal currents on said circuit, an audio amplifier input circuit including a capacitor having one terminal connected to said rectifier circuit through a high frequency choke and its other terminal connected to another cold electrode, a third cold electrode, and an audio output circuit connected between the cathode and said third named electrode.

3. In combination, in a high frequency receiver, a tube including a cathode, an anode, and at least two intermediate cold electrodes, a high frequency input circuit connected between one of the said cold electrodes and the cathode and including a rectification network, the other cold electrode being connected to a point on said input circuit whereby rectified energy is impressed thereon, an output circuit connected between said anode and cathode, and said other cold electrode being disposed between the cathode and said one cold electrode whereby the high frequency voltage on said one electrode has a comparatively small effect upon the electron stream.

4. In a receiver, a combined detector-amplifier stage including a tube provided with a cathode, a grid, a main anode, and at least one auxiliary cold electrode positioned within the electron stream between the cathode and the main anode, a resonant high frequency signal input circuit connected between said auxiliary electrode and said cathode, a leaky condenser in the said resonant circuit connected between the auxiliary electrode and the cathode, a connection including a high frequency choke coil and a capacitor in series, from the said grid to the high potential side of said condenser, and an audio frequency output circuit connected between the cathode and the main anode.

5. In combination, a combined detector-amplifier comprising a tube having its cathode and a remote cold electrode coupled to serve as a diode rectifier circuit, means exclusive of said tube for impressing high frequency signal currents on said circuit, an audio amplifier input circuit including a capacitor having one terminal connected to said rectifier circuit and its other terminal connected to another cold electrode, a third cold electrode, and an audio output circuit connected between the cathode and said third named electrode, said remote electrode being the anode of the tube, a fourth cold electrode, positive in potential, adjacent to the second cold electrode, the second, third and fourth cold electrodes being disposed between the cathode and anode electrode.

6. In combination, a combined detector-amplifier comprising a tube having its cathode and a remote cold electrode coupled to serve as a diode rectifier circuit, means for impressing high frequency signal currents on said circuit, an audio amplifier input circuit including a capacitor having one terminal connected to said rectifier circuit and its other terminal connected to another cold electrode, a third cold electrode, and an audio output circuit connected between the cathode and said third named electrode, said audio output circuit being free of any electrical coupling with said diode circuit, said remote electrode being the anode of the tube, the remaining two cold electrodes being disposed between the cathode and anode electrode.

7. In combination, a combined detector-amplifier comprising a tube having its cathode and a remote cold electrode coupled to serve as a diode rectifier circuit, means for impressing high frequency signal currents on said circuit, an audio amplifier input circuit including a capacitor having one terminal connected to said rectifier circuit and its other terminal connected to another cold electrode, a third cold electrode, and an audio output circuit connected between the cathode and said third named electrode and a positive cold electrode disposed between the second and third cold electrodes, the second, third and positive electrodes being located between the cathode and said remote electrode.

8. In combination, a combined detector-amplifier comprising a tube having its cathode and a remote cold electrode coupled to serve as a diode rectifier circuit, means for impressing high frequency signal currents on said circuit, an audio amplifier input circuit including a capacitor having one terminal connected to said rectifier circuit and its other terminal connected to another cold electrode, a third cold electrode, an audio output circuit connected between the cathode and said third named electrode and a positive auxiliary electrode disposed between the cathode and said second cold electrode, the second, third and auxiliary electrodes being positioned between the cathode and said remote electrode.

9. In a wave receiving system, an electron discharge tube of the type including a cathode, an output plate, and at least three grids arranged in the electron stream between the cathode and plate, a wave input circuit connected between the cathode and one of said grids, an input circuit for energy of a different frequency connected between the cathode and a second of said grids, said wave input circuit including a leaky condenser network for negatively biasing the first grid when waves are impressed on the said wave input circuit, means for negatively biasing the second grid, means for maintaining the third of said grids at a positive direct current voltage with respect to the cathode but at the same alternating current potential as the latter, said third grid being located between the first and second grids, an output circuit connected between the plate and cathode, and means coupling said input circuits in such a manner that said energy of a different frequency is derived from said leaky condenser network.

KNOX C. BLACK.